(12) United States Patent
Carroll

(10) Patent No.: US 7,790,051 B1
(45) Date of Patent: Sep. 7, 2010

(54) ISOLATING AND MOVING SINGLE ATOMS USING SILICON NANOCRYSTALS

(75) Inventor: Malcolm S. Carroll, Albuquerque, NM (US)

(73) Assignee: Sandia Corporation, Albuquerque, NM (US)

( * ) Notice: Subject to any disclaimer, the term of this patent is extended or adjusted under 35 U.S.C. 154(b) by 560 days.

(21) Appl. No.: 11/931,155

(22) Filed: Oct. 31, 2007

(51) Int. Cl.
*C03C 15/00* (2006.01)
*C03C 25/68* (2006.01)

(52) U.S. Cl. .................. 216/87; 977/855; 977/856; 977/858; 977/888

(58) Field of Classification Search ................ 216/87; 977/855, 856, 888, 858
See application file for complete search history.

(56) References Cited

U.S. PATENT DOCUMENTS

| | | | |
|---|---|---|---|
| 6,472,681 | B1 | 10/2002 | Kane |
| 6,774,061 | B2 * | 8/2004 | Coffa et al. ............. 438/197 |
| 7,081,664 | B2 | 7/2006 | Hill |
| 2006/0042414 | A1 * | 3/2006 | Sankaran et al. ......... 75/346 |
| 2006/0110883 | A1 * | 5/2006 | Min .................... 438/260 |

OTHER PUBLICATIONS

B. E. Kane, "A silicon-based nuclear spin quantum computer", Nature, vol. 393, May 1998, pp. 133-137.
Fabio Iacona et al, "Correlation between luminescence and structural properties of Si nanocrystals", Journal of Applied Physics, vol. 87, No. 3, 2000, pp. 1295-1303.
Elizabeth A. Boer et al, "Models of quantitative charge imaging by atomic force microscopy", Journal of Applied Physics, vol. 90, No. 6, 2001, pp. 2764-2772.
Todd D. Krauss et al, "Charge and Photoionization Properties of Single Semiconductor Nanocrystals", Journal of Applied Physics, vol. 105, No. 9, 2001, pp. 1725-1733.
J.L. O'Brien et al, "Towards the fabrication of phosphorus qubits for a silicon quantum computer", The American Physical Society, vol. 64, 2001, pp. 161401-1 through 161401-4.
Yoshio Kikuchi, et al, "Quantitative Ultra Shallow Dopant Profile Measurement by Scanning Capacitance Microscope", Fujitsu Sci. Tech. J., vol. 38, No. 1, 2002, pp. 75-81.
A. J. Skinner, et al, "Hydrogenic Spin Quantum Computing in silicon: A Digital Approach", The American Physical Society, vol. 90, No. 8, 2003, pp. 087901-1 through 087901-4.
D. K. Armani, et al, "Ultra-High Q Toroid Microcavity on a chip", Letters to Nature, vol. 421, 2003, pp. 925-928.
Sebastien Decossas et al, "Atomic force microscopy nanomanipulation of silicon nanocrystals for nanodevice fabrication", Institute of Physics Publishing, Nanotechnology, vol. 14 2003, pp. 1272-1278.

(Continued)

*Primary Examiner*—Roberts Culbert
(74) *Attorney, Agent, or Firm*—John P. Hohimer

(57) ABSTRACT

A method is disclosed for isolating single atoms of an atomic species of interest by locating the atoms within silicon nanocrystals. This can be done by implanting, on the average, a single atom of the atomic species of interest into each nanocrystal, and then measuring an electrical charge distribution on the nanocrystals with scanning capacitance microscopy (SCM) or electrostatic force microscopy (EFM) to identify and select those nanocrystals having exactly one atom of the atomic species of interest therein. The nanocrystals with the single atom of the atomic species of interest therein can be sorted and moved using an atomic force microscope (AFM) tip. The method is useful for forming nanoscale electronic and optical devices including quantum computers and single-photon light sources.

19 Claims, 5 Drawing Sheets

16

OTHER PUBLICATIONS

R. G. Clark, et al, "Progress in silicon-based quantum computing", The Royal Society, vol. 361, 2003, pp. 1451-1471.

R. Beyer, et al, "Scanning capacitance microscopy and -spectroscopy on SiO2 films with embedded Ge and Si nanoclusters", Microelectronic Engineering, vol. 72, 2004, pp. 207-212.

Oksana Cherniavskaya et al, "Imaging the Photoionization of Individual CdSe/CdS Core-Shell Nanocrystals on n- and p-Type Silicon Substrates with Thin Oxides", J. Phys. Chem, 2004, vol. 108, No. 16, pp. 4946-4961.

Wei Pan, "Abstract Submitted for the Mar05 Meeting of the American Physical Society", 2004.

A. J. Kenyon, "Erbium in silicon", Institute of Physics Publishing, Semicond. Sci. Technol. vol. 20, 2005, R65-R84.

Brahim Lounis et al, "Single-photon sources", Institute of Physics Publishing, Reports on Progress in Physics, vol. 68 2005, pp. 1129-1179.

Mark Oxborrow et al, "Single-photon sources", Contemporary Physics, vol. 46, No. 3, 2005, pp. 173-206.

M. Trupke, et al, "Microfabricated high-finesse optical cavity with open access and small volume", Applied Physics Letters, vol. 87, 2005, pp. 211106-1 thru 211106-3.

Wei Pan et al, "Experimental Studies of Photoluminescence in Mn-Ion Implanted Silicon rich Oxide Thin Film", Mater. Res. Soc. Symp. Proc., vol. 910 2006.

M. S. Carroll, et al, "Silicon nanocrystal growth in the long diffusion length regime using high density plasma chemical vapour deposited silicon rich oxides", IOP Publishing, Nanotechnology, vol. 18 2007, pp. 315707 (7pp).

C. D. Hill, et al "Global control and fast solid-state donor electron spin quantum computing", Physical Review vol. 72, 2005, pp. 045350-1 through 045350-9.

* cited by examiner

ISOLATING AND MOVING SINGLE ATOMS USING SILICON NANOCRYSTALS

GOVERNMENT RIGHTS

This invention was made with Government support under Contract No. DE-AC04-94AL85000 awarded by the U.S. Department of Energy. The Government has certain rights in the invention.

FIELD OF THE INVENTION

The present invention relates in general to nanocrystals and in particular to the use of silicon nanocrystals as a way of isolating and moving single atoms of an atomic species of interest. The present invention also relates a method for inserting single atoms of an atomic species of interest into a quantum computer which is being built up on a substrate.

BACKGROUND OF THE INVENTION

The emerging fields of quantum computing and single-photon light sources require a precise placement of single atoms of a particular atomic species within a quantum computer or within a high-Q optical cavity, respectively. This is currently extremely difficult due to the small size of individual atoms which does not allow them to be easily manipulated. What is needed Is a way to get a handle on the individual atoms so that they can be moved using existing tools either on a microscopic scale, or on a nanoscale. Also needed is a way to get the individual atoms to remain at a particular location once they have been placed there.

The present invention addresses these needs by providing methods for isolating single atoms of an atomic species of interest within silicon nanocrystals so that the single atoms can be easily moved by using an atomic force microscope to move the silicon nanocrystals containing the single atoms. Since the single atoms have been isolated within the silicon nanocrystals, they will remain in place once the nanocrystals have been set at a particular location.

The methods of the present invention are compatible with existing atomic force microscopy tools, and are also compatible with conventional silicon device fabrication technology.

These and other advantages of the present invention will become evident to those skilled in the art.

SUMMARY OF THE INVENTION

The present invention relates to a method for isolating single atoms of an atomic species of interest (e.g. phosphorous or erbium) within silicon nanocrystals to provide for movement of each single atom using an atomic force microscope tip to move the silicon nanocrystal containing that single atom. The method comprises the steps of providing a substrate having the silicon nanocrystals located thereon; implanting the silicon nanocrystals with ions of the atomic species of interest at an ion energy and at an ion dose rate which statistically implants, on average, only one of the ions of the atomic species of interest into each silicon nanocrystal; and measuring an electrical charge distribution of the silicon nanocrystals and thereby identifying which of the silicon nanocrystals contain the single atom of the atomic species of interest and which of the silicon nanocrystals contain a different number of atoms (e.g. 0 or 2 atoms) of the atomic species of interest.

The method can further comprise a step of separating with an atomic force microscope tip at least one of the silicon nanocrystals containing the single atom of the atomic species of interest from the silicon nanocrystals containing the different number of atoms of the atomic species of interest. In some cases, the separating step with the atomic force microscope tip can comprise removing one or more of the silicon nanocrystals containing the single atom of the atomic species of interest from the substrate and placing those silicon nanocrystals onto another substrate using the atomic force microscope tip.

The present invention further relates to a method for isolating single atoms of an atomic species of interest within silicon nanocrystals so that each single atom can be moved by moving the silicon nanocrystal containing that single atom with an atomic force microscope tip. The method comprises the steps of: forming on a substrate a layer of a silicon-rich oxide; thermally annealing the layer of the silicon-rich oxide and thereby phase segregating the layer of the silicon-rich oxide to form a layer of silicon oxide and also to form the silicon nanocrystals within the layer of silicon oxide; implanting the silicon nanocrystals with ions of the atomic species of interest at an ion energy and at an ion dose rate which statistically implants, on average, only one of the ions of the atomic species of interest into each silicon nanocrystal; etching away the silicon oxide and thereby releasing the silicon nanocrystals from the layer of silicon oxide, with the silicon nanocrystals being disposed on the substrate; measuring an electrical charge distribution on a set of the silicon nanocrystals using the atomic force microscope tip and thereby identifying which silicon nanocrystals in the set of the silicon nanocrystals have the single atom of the atomic species of interest located therein; and spatially separating with the atomic force microscope tip the silicon nanocrystals in the set of the silicon nanocrystals having the single atom of the atomic species of interest located therein from a remainder of the set of the silicon nanocrystals which have a greater or a lesser number of atoms of the atomic species of interest. Each silicon nanocrystal can have dimensions which are generally in the range of 1-30 nanometers (nm), and preferably in the range of 1-10 nm. The atomic species of interest can comprise any element in the periodic table that dopes the silicon nanocrystal, and in particular can comprise phosphorous or erbium.

The step of forming on the substrate the layer of the silicon-rich oxide can comprise forming the silicon-rich oxide on an electrically-conducting substrate such as a silicon substrate which has been doped for electrical conductivity.

The step of forming on the substrate the layer of the silicon-rich oxide can comprise depositing the layer of the silicon-rich oxide on the substrate by chemical vapor deposition. Alternately, the step of forming on the substrate the layer of the silicon-rich oxide can comprise thermally oxidizing a portion of a silicon substrate and forming therefrom a layer of a thermal oxide, and then implanting silicon ions into the layer of the thermal oxide and thereby converting the layer of the thermal oxide into the layer of the silicon-rich oxide.

The step of thermally annealing the layer of the silicon-rich oxide can comprise thermally annealing the layer of the silicon-rich oxide at a temperature in the range of 1000-1200° C. The silicon nanocrystals can also be thermally annealed after they have been implanted with the ions of the atomic species of interest.

The step of etching the silicon oxide can comprise etching the silicon oxide with an etchant comprising hydrofluoric acid (HF).

The step of spatially separating the silicon nanocrystals having the single atom of the atomic species of interest located therein can comprise moving with an atomic force microscope tip the silicon nanocrystals having the single atom of the atomic species of interest located therein.

The present invention also relates to a method for inserting single atoms of an atomic species of interest into a quantum computer which is being built up. The method comprises the steps of: isolating the single atoms of the atomic species in silicon nanocrystals; measuring an electrical charge distribution in the silicon nanocrystals using the atomic force microscope tip and thereby identifying which of the silicon nanocrystals contain the single atom of the atomic species of interest; and removing a portion of the silicon nanocrystals containing the single atom of the atomic species of interest from the first substrate using the atomic force microscope tip, and re-locating the portion of the silicon nanocrystals containing the single atom of the atomic species of interest onto a second substrate to form a plurality of quantum bits in the quantum computer being built up on the second substrate. The method can further comprise a step of securing each silicon nanocrystal on the second substrate by depositing an electrically-insulating layer over the second substrate. Additionally, the method can comprise a step of depositing a plurality of spaced-apart electrodes over the electrically-insulating layer with one of the plurality of electrodes being located above each of the silicon nanocrystals. The atomic species of interest preferably comprises phosphorous-31 when the silicon nanocrystals containing the single atoms are used to form a quantum computer.

The step of isolating the single atoms of the atomic species in silicon nanocrystals further comprises: providing a first substrate; forming on the first substrate a layer of a silicon-rich oxide; thermally annealing the layer of the silicon-rich oxide and thereby converting the layer of the silicon-rich oxide into a layer of silicon oxide containing the silicon nanocrystals; implanting the silicon nanocrystals with ions of the atomic species of interest at an ion energy and at an ion dose rate which statistically implants, on average, only one of the ions of the atomic species of interest into each silicon nanocrystal; and etching away the layer of silicon oxide to release the silicon nanocrystals.

Additional advantages and novel features of the invention will become apparent to those skilled in the art upon examination of the following detailed description thereof when considered in conjunction with the accompanying drawings. The advantages of the invention can be realized and attained by means of the instrumentalities and combinations particularly pointed out in the appended claims.

BRIEF DESCRIPTION OF THE DRAWINGS

The accompanying drawings, which are incorporated into and form a part of the specification, illustrate several aspects of the present invention and, together with the description, serve to explain the principles of the invention. The drawings are only for the purpose of illustrating preferred embodiments of the invention and are not to be construed as limiting the invention. In the drawings.

DETAILED DESCRIPTION OF THE INVENTION

Isolating single atoms 12 of an atomic species of interest according to the present invention requires silicon nanocrystals 14 into which the single atoms can be placed. The silicon nanocrystals 14 can either be procured commercially or can be fabricated as described in detail hereinafter with reference to FIGS. 1A-1G which schematically illustrate in cross-section views a series of steps for forming the silicon nanocrystals 14 on a substrate 16. The term "nanocrystal" as used herein refers to an assembly of atoms with an at least partially crystalline structure and having overall dimensions of about 100 nanometers or less.

Figure 1A:
FIGS. 1A-1G show schematic cross-section views to illustrate steps for forming silicon nanocrystals which contain a single atom of an atomic species of interest according to the present invention.

In FIG. 1A, the substrate 16 can comprise a conventional semiconductor substrate such as a silicon substrate 16 (i.e. a silicon wafer, or a portion thereof). The silicon substrate 16 can have a {100} crystalline orientation, for example, and can be doped with boron or phosphorous to a concentration of about $10^{19}$ cm$^{-3}$ or more to make the substrate 16 electrically conducting. Doping of the silicon substrate 16 is not required to form the silicon nanocrystals 14, but will be useful for later determining an electrical charge distribution of the silicon nanocrystals 14 using scanning capacitance microscopy as will be described in detail hereinafter.

Figure 1B:
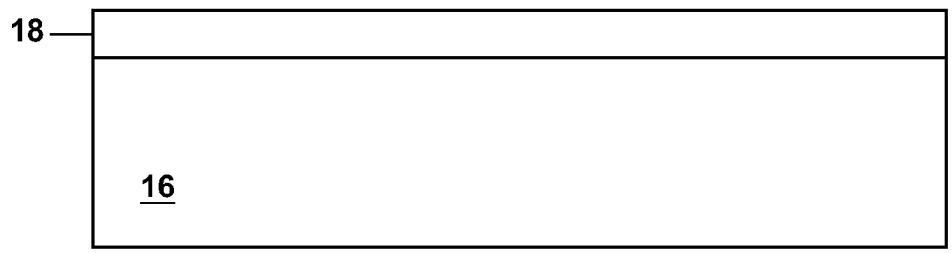

In FIG. 1B, a layer 18 of a silicon-rich oxide can be formed on the silicon substrate 16 with a thickness of a few tenths of a micron (e.g. 0.3 µm). This can be done by depositing the silicon-rich oxide by a chemical vapor deposition process such as high-density plasma chemical vapor deposition (HDP-CVD). The term "silicon-rich oxide" as used herein refers to a non-stoichiometric composition of silicon and oxygen SiO$_x$ with x<2.

A buffer layer having a thickness of a few tens of nanometers can be optionally provided on the substrate 16 prior to depositing the silicon-rich oxide layer 18. The buffer layer can comprise, for example, a thermal oxide (i.e. silicon dioxide) which is formed by thermally oxidizing a portion of the silicon substrate 16 at an elevated temperature (e.g. 1050° C.).

Deposition of the silicon-rich oxide layer 18 can be performed by HDP-CVD at a plasma chamber pressure of 5-25 milliTorr using argon (Ar), oxygen (O$_2$) and silane (SiH$_4$) as source gases. The flow rates for the source gases can be in the range of 120-350 standard cubic centimeters (sccm) for argon, 10-180 sccm for oxygen, and 8-90 sccm for silane. The silicon content in the silicon-rich oxide can be controlled by controlling the oxygen flow rate, which determines the partial pressure of oxygen in the HDP-CVD chamber, while keeping the flow rates of argon and silane fixed. The deposition rate of the silicon-rich oxide layer 18 can be controlled by varying the applied RF power in addition to varying the flow rates of the source gases. A low deposition rate of about 1 nanometer per second for the silicon-rich oxide layer 18 can be achieved with an RF power of about 150 Watts applied to a side coil in the plasma chamber. A much higher deposition rate of about 9 nanometers per second for the silicon-rich oxide layer 18 can be achieved with a overall top coil, side coil and bias electrode RF power of about 6 kiloWatts. During deposition, the silicon substrate 16 can be maintained at a temperature in the range of about 300-450° C. Further details for the deposition of silicon-rich oxide layers by HDP-CVD can be found in an article by M. S. Carroll et al., entitled "Silicon Nanocrystal Growth in the Long Diffusion Length Regime Using High Density Plasma Chemical Vapor Deposited Silicon Rich Oxides," *Nanotechnology*, vol. 18, p. 315707, 6 Jul. 2007, which is incorporated herein by reference.

Alternately, the silicon-rich oxide layer 18 in FIG. 1B can be formed from a thermal oxide layer which can be up to a few tenths of a micron thick. The thermal oxide layer can be formed by thermally oxidizing a portion of the silicon substrate 16 at an elevated temperature of about 1050° C. in a dry oxygen ambient for about 0.5-1.5 hours depending upon the exact thickness of the thermal oxide layer being formed. Thermal oxidation converts this portion of the silicon substrate 16 from silicon to silicon dioxide ($SiO_2$).

After formation of the thermal oxide layer, an excess of silicon can be added to the thermal oxide layer to convert the thermal oxide layer into the silicon-rich oxide layer 18. This can be done using an ion implantation step. Ion implantation of the thermal oxide layer can be performed at several different energies and dose rates to more uniformly disperse the implanted silicon ions throughout the thermal oxide layer. Isotopically pure silicon-28 can be ion implanted into the thermal oxide layer to form silicon nanocrystals 14 which comprise isotopically pure silicon-28 when this is needed (e.g. to form a quantum computer).

To form the silicon nanocrystals 14, the silicon-rich oxide layer 18 however formed can be thermally annealed. This annealing step can be performed in a horizontal furnace in an argon or nitrogen ambient at a temperature in the range of 1000-1200° C. for a time period in the range of 1-3 hours. The annealing step produces a phase segregation of the silicon-rich oxide layer 18 which results in the formation of a more-stoichiometric silicon oxide layer 20 and the growth of the silicon nanocrystals 14 which precipitate out of the silicon-rich oxide layer 20. In the ideal case, if all the excess silicon were precipitated out, the silicon oxide layer 20 would be stoichiometric (i.e. $SiO_2$). Whether or not this occurs in practice will depend upon the exact annealing temperature and time which is used and is not particularly relevant since the silicon oxide layer 20 will be removed with a selective etchant as will be described hereinafter.

Figure 1C:
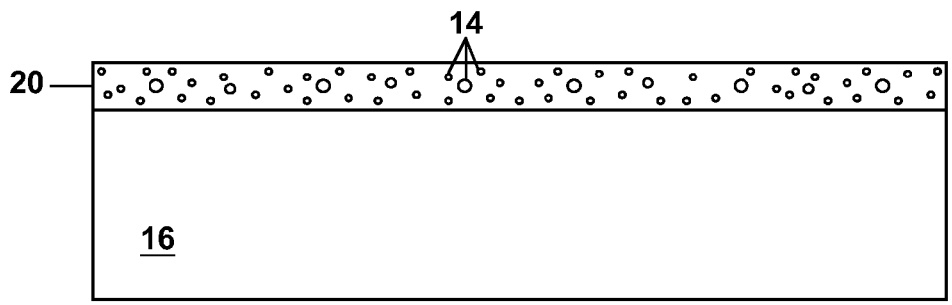

The formation of the silicon nanocrystals 14 begins with initial seed crystals being formed from the excess silicon in the silicon-rich oxide layer 18 with the seed crystals then growing to form the silicon nanocrystals 14 as additional silicon atoms thermally diffuse and attach themselves onto the seed crystals. The silicon nanocrystals 14, which are generally spherically shaped with dimensions in the range of 1-30 nm and preferably about 1-10 nm, are distributed throughout the silicon oxide layer 20 as shown in FIG. 1C. Larger-sized nanocrystals 14 are generally located near the middle of the silicon oxide layer 20; and smaller-sized nanocrystals 14 are generally located near the top and bottom of the silicon oxide layer 20. The exact size range and density of the silicon nanocrystals 14 will depend upon a number of factors including how much excess silicon is present in the silicon-rich oxide layer 18, how the excess silicon is distributed throughout the silicon-rich oxide layer 18, the thickness of the silicon-rich oxide layer 18, and the annealing temperature and time. The density of the silicon nanocrystals 14 in the silicon oxide layer 20 after the annealing step can be, for example, about $10^{17}$ cm$^{-3}$.

After formation of the silicon nanocrystals 14, an ion implantation step can be used to implant, on average, a single atom 12 of an atomic species of interest into each silicon nanocrystal 14. This is schematically illustrated in the cross-section view of FIG. 1D which depicts the single atoms 12 during the ion implantation step by vertical lines with arrows. Those skilled in the art understand that for ion implantation, the atoms 12 must be in an ionized state and are referred to as ions. An ion is simply an atom having one or more added or removed electrons. Therefore, the terms "atom" and "ion" will be used interchangeably herein.

Figure 1D:
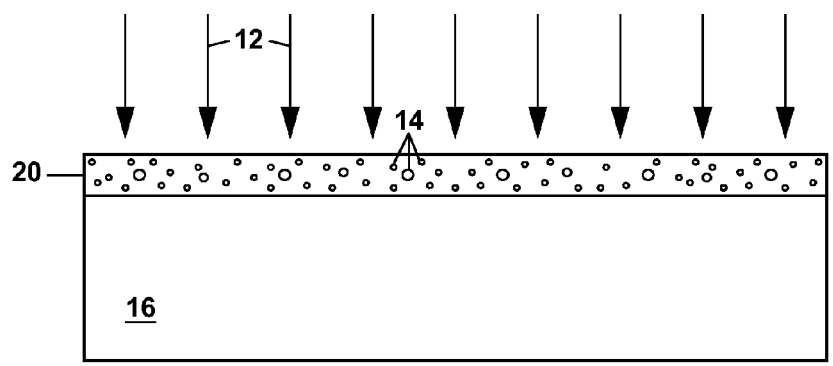

In FIG. 1D, the ion implantation step can be performed using multiple ion energies and dose rates as needed to ensure that, on average, one ion of the atomic species of interest (e.g. phosphorous or erbium) will be implanted into each silicon nanocrystal 14. As an example, phosphorous-31 ions can be implanted at energies of 40, 100 and 250 keV with an overall ion dose rate of about $3 \times 10^{14}$ cm$^{-2}$ when the density of silicon nanocrystals 14 is $10^{17}$ cm$^{-3}$ in a 300-nm-thick silicon oxide layer 20. The above example assumes that the phosphorous-31 ions are uniformly implanted throughout the volume of the silicon oxide layer 20 and that about 1% of the volume of the silicon oxide layer 20 is occupied by the silicon nanocrystals 14, with the silicon nanocrystals 14 being spherical with an average diameter of about 6 nanometers and being uniformly distributed throughout the silicon oxide layer 20.

Computer programs for ion implantation, which are well known to those skilled in the ion implantation art, can also be used to calculate an ion implantation profile in the silicon oxide layer 20 based on one or more ion implantation energies and dose rates so that, on average, one atom 12 of the atomic species of interest will be implanted into each silicon nanocrystal. In practice, although a majority of the silicon nanocrystals 14 will contain one atom 12 of the atomic species of interest after the ion implantation step, some silicon nanocrystals 14 will contain more than one atom 12, and other silicon nanocrystals 14 will not contain any atoms 12 at all. The method of the present invention can provide for this situation as will be described hereinafter by identifying those silicon nanocrystals 14 which contain exactly one atom 12 of the atomic species of interest so that they can be sorted out from the remaining silicon nanocrystals 14 which contain more or less atoms 12 of the atomic species of interest.

The ion implantation step in FIG. 1D will implant substantially all of the atoms 12 of the atomic species of interest into the interior of the silicon nanocrystals 14 rather than having the atoms 12 located on a surface of the silicon nanocrystals 14. This is important to isolate the atoms 12 so that they do not later become detached from the silicon nanocrystals 14 (e.g. through thermal diffusion, or through a chemical reaction).

After the ion implantation step in FIG. 1D, an optional post-implant annealing step can be performed to reduce or remove any damage to the silicon nanocrystals 14 as a result of inserting the atoms 12 into the nanocrystals 14 by ion implantation. This post-implant annealing step can be performed at a temperature in the range of 800-1000° C. for a few minutes.

Figure 1E:
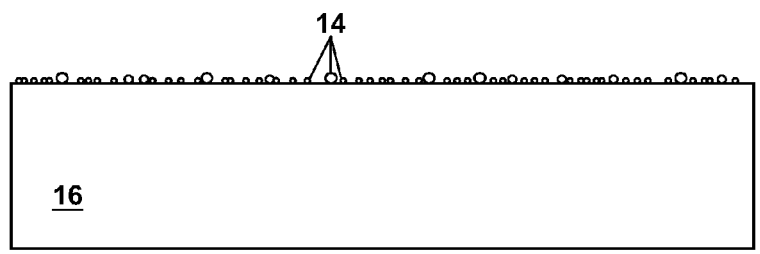

In FIG. 1E, after the ion implantation step, the silicon oxide layer 20 can be removed with a selective etching step to leave the silicon nanocrystals 14 intact on the silicon substrate 16. This releases the silicon nanocrystals 14 from the silicon oxide layer 20 so that the nanocrystals 14 can be sorted and moved. The selective etching step can be performed, for example, by dipping the silicon substrate 16 into a hydrofluoric acid (HF)-based etchant for sufficient time to etch away the silicon oxide layer 20 (e.g. a few minutes or longer). Alternately, the selective etching step can be performed using gaseous HF. The selective etching step can also be performed by exposing the silicon substrate 16 and the silicon oxide layer 20 to a fluorine-containing plasma (e.g. an $CHF_3/H_2$ plasma) for sufficient time to completely etch away the silicon oxide layer 20.

Exposure of the silicon nanocrystals 14 and the silicon substrate 16 to air for a few hours after the etching step can result in the formation of a thin native oxide over the surfaces of the nanocrystals 14 and substrate 16. This is not detrimental to a later movement of the nanocrystals 14, or to a measurement of an electrical charge therein to determine how many atoms 12 of the atomic species of interest are present in each silicon nanocrystal 14.

After releasing the silicon nanocrystals 14 by the etching step, a set of the silicon nanocrystals 14 can be sorted to identify those nanocrystals 14 containing exactly one atom 12 of the atomic species of interest therein so that the nanocrystals 14 containing exactly one atom 12 of the atomic species of interest can be spatially separated from the remainder of the nanocrystals 14 which contain a greater or a lesser number of atoms 12 of the atomic species of interest. This can be done, for example, using a conventional atomic force microscope (AFM) 100 to measure the electrical charge on the silicon nanocrystals 14 at room temperature by scanning capacitance microscopy (SCM), or alternately by electrostatic force microscopy (EFM).

In the silicon nanocrystals 14, the atoms 12 can form either donors or acceptors depending upon the atomic species of interest. Those skilled in the art understand that a donor is an atom of an impurity within a semiconductor such as silicon that can dope the semiconductor n-type by donating one or more electrons to the semiconductor with the donated electrons becoming extra "free" electrons in the conduction band of the semiconductor. Those skilled in the art also understand that an acceptor is an atom of an impurity within a semiconductor such as silicon that can dope the semiconductor p-type by removing one or more electrons from the semiconductor thereby producing holes in the valence band of the semiconductor. Phosphorous and erbium atoms 12, which are of particular interest for forming quantum computers and single-photon light sources, respectively, are both donors when they are implanted into the silicon nanocrystals 14. This results in the silicon nanocrystals 14 having a net electrical charge therein which can be measured by SCM or EFM to determine exactly how many phosphorous or erbium atoms 12 are present within each silicon nanocrystal 14.

Figure 1F:
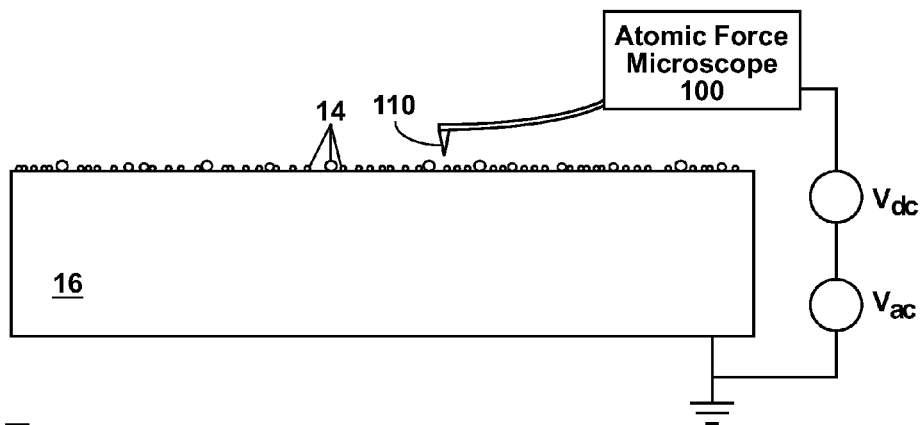

SCM and EFM both involve capacitive coupling between the AFM tip 110 and the silicon substrate 16 which is electrically conducting and grounded. To measure the electrical charge on a plurality of the silicon nanocrystals 14 due to the doping therein by the atoms 12 using SCM or EFM, a sensing tip 110 of the AFM 100 can be scanned above the silicon nanocrystals 14 being measured as shown in FIG. 1F. An alternating current (ac) voltage, $V_{ac}$, from a few tenths of a Volt up to a few Volts can be applied between the AFM tip 110 and the silicon substrate 16 which can be electrically grounded as shown in FIG. 1F. The ac voltage, $V_{ac}$, includes a modulation component at a resonant frequency (e.g. 50-100 kHz) of the AFM tip 110 and a cantilever upon which the AFM tip 110 is suspended, and an additional modulation component which is generally in the 900-1000 KHz range which is used to measure a change in capacitance, dC, of the silicon nanocrystals 14 with a change, dV, in the ac voltage, $V_{ac}$. The change in capacitance with voltage, dC/dV, can be measured using a lock-in amplifier and used to form a SCM or EFM image of the silicon nanocrystals 14 with the electrical charge therein indicated by the contrast in the image. A direct current (dc) bias voltage, $V_{dc}$, can also be applied between the AFM tip 110 and the silicon substrate 16 to bias the contrast of the SCM or EFM image of the nanocrystals 14. For EFM, an electrostatic force of attraction between the charge in the silicon nanocrystal 14 and the AFM tip 110 is measured to form the EFM image of the silicon nanocrystals 14 with the electrical charge also being indicated by the contrast in the image. Nanocrystals 14 without any electrical charge therein can be made to appear dark in the SCM or EFM image, and nanocrystals 14 with an electrical charge therein can be made to appear bright (i.e. light) with the brightness of the nanocrystals 14 increasing with an increasing charge therein. Each SCM or EFM image can map out the topography and electrical charge distribution over an x-y range of about 500 nm square.

To perform the SCM or EFM measurement, the AFM tip 110 can be brought into close proximity to the silicon nanocrystals 14 without touching or moving the nanocrystals 14. For maximum spatial resolution and to provide the greatest sensitivity in detecting the charge on each silicon nanocrystal 14, the AFM tip 110 can be sharpened to about 10 nm. No additional electrical charge needs to be injected into the silicon nanocrystals 14 for the SCM or EFM measurement, since the atoms 12 therein dope the silicon nanocrystals 14 and provide the electrical charge therein.

If needed, the silicon nanocrystals 14 can be moved about on the silicon substrate 16 to separate the nanocrystals 14 so that the SCM or EFM measurement can be made on each individual silicon nanocrystal 14 while avoiding any interference on the measurement from the electrical charges in adjacent nanocrystals 14. Movement of the silicon nanocrystals 14 can be performed using the atomic force microscope tip 110. This can be done by using the tip 110 to push against a side of each nanocrystal 14 being moved to laterally displace that nanocrystal 14 as the tip 110 is moved. Alternately, the tip 110 can be used to electrostatically pick up each nanocrystal 14 and then set that nanocrystal 14 down elsewhere on the substrate 16. This can be done by applying a direct current (dc) electrical voltage of a few Volts onto the tip 110 to produce an attractive Coulomb force which attracts the electrically-charged nanocrystal 14 to the tip 110. The nanocrystal 14 can then be released from the tip 110 and set down on the substrate 16 using an opposite voltage of about the same magnitude which produces a repulsive Coulomb force between the tip 110 and the electrically-charged nanocrystal 14.

Further details of SCM can be found in Y. Kikuchi et al., "Quantitative Ultra Shallow Dopant Profile Measurement by Scanning Capacitance Microscope," *Fujitsu Scientific and Technical Journal*, vol. 38, pp. 75-81, June 2002; and R. Beyer et al., "Scanning Capacitance Microscopy and—Spectroscopy on $SiO_2$ Films with Embedded Ge and Si Nanoclusters," *Microelectronic Engineering*, vol. 72, pp. 207-212, 2004. Further details of EFM can be found in T. D. Krauss et al., "Charge and Photoionization Properties of Single Semiconductor Nanocrystals," *Journal of Physical Chemistry B*, vol. 105, pp. 1725-1733, 7 Feb. 2001; E. A. Boer et al., "Models for Quantitative Charge Imaging by Atomic Force Microscopy," *Journal of Applied Physics*, vol. 90, pp. 2764-2772, 15 Sep. 2001; and O. Cherniayskaya et al., "Imaging the Photoionization of Individual CdSe/CdS Core—Shell Nanocrystals on n- and p-Type Silicon Substrates with Thin Oxides," *Journal of Physical Chemistry B*, vol. 108, pp. 4946-4961, 30 Mar. 2004. Each of the above references are incorporated herein by reference.

Figure 1G:
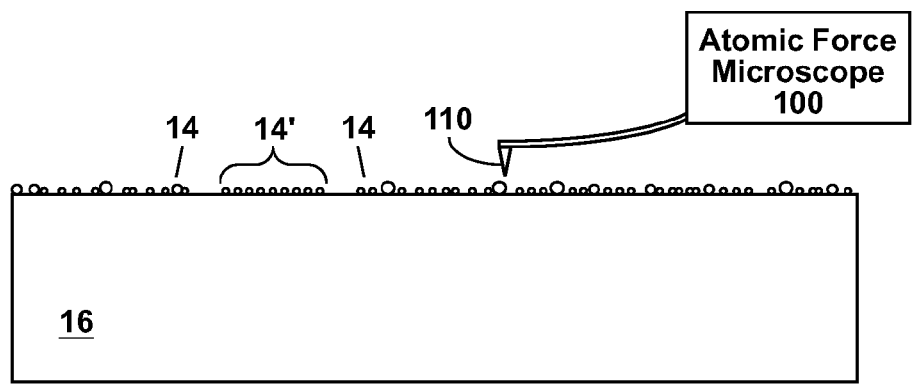

In addition to sorting the silicon nanocrystals 14 according to the number of atoms 12 of the atomic species of interest which are contained therein (i.e. sorting the nanocrystals 14 according to the electrical charge therein due to the implanted atoms 12), the nanocrystals 14 can also be sorted according to size. This can be done using the SCM or EFM image of the nanocrystals 14 to determine the size of the nanocrystals 14, and then using the AFM tip 110 to move silicon nanocrystals 14 of a particular size to a site on the substrate 16, with each nanocrystal 14 further being selected to have exactly one atom 12 of the atomic species of interest therein. This is schematically illustrated in FIG. 1G which shows a set of selected silicon nanocrystals 14' (hereafter referred to as selected nanocrystals 14') which have been identified as having exactly one atom 12 of the atomic species of interest therein, with the selected nanocrystals 14' all being of approximately the same size and being spatially separated from the remainder of the silicon nanocrystals 14. One or more of the selected nanocrystals 14' can be utilized on the silicon substrate 16 for constructing various types of nanoscale electrical or optical devices such as quantum computers or single-photon light sources, or can be transferred to a different substrate 22 to form such devices.

As an example, of the utility of the selected nanocrystals 14' having exactly one atom 12 of the atomic species of interest therein, a prototype for a quantum computer 200 will be described hereinafter with reference to FIGS. 2A-2D. This example illustrates how the selected nanocrystals 14' prepared according to FIGS. 1A-1G can be inserted into a device which is being built up by a combination nanofabrication technology and semiconductor processing technology. FIGS. 2A-2D schematically illustrate in cross-section views a method for inserting single atoms 12 of the atomic species of interest into the quantum computer 200 which is being built up using the selected nanocrystals 14'.

Further details of the operation of quantum computers can be found in U.S. Pat. No. 6,472,681. See also R. G. Clark et al., "Progress in Silicon-Based Quantum Computing," *Philosophical Transactions of the Royal Society London A*, vol. 361, pp. 1451-1471, 2003; J. L. O'Brien et al., "Towards the Fabrication of Phosphorous Qubits for a Silicon Quantum Computer," *Physical Review B*, vol. 64, p. 161401, 21 Sep. 2001; and C. D. Hill et al., "Global Control and Fast Solid-State Donor Electron Spin Quantum Computing," *Physical Review B*, vol. 72, p. 045350, 22 Jul. 2005. Each of these references are incorporated herein by reference.

Figure 2A:
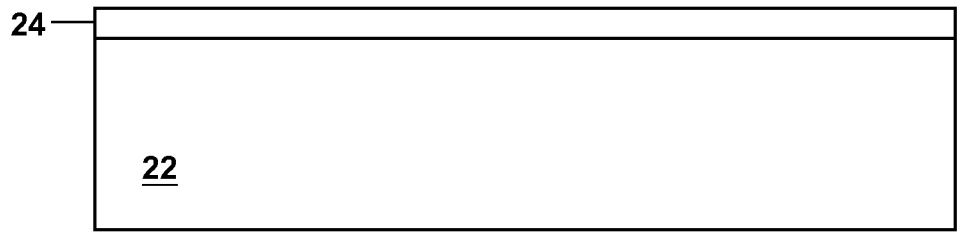
FIGS. 2A-2D show schematic cross-section views to illustrate a method for inserting the silicon nanocrystals of FIG. 1G containing the single atom of the atomic species of interest into a quantum computer which is being built up.

In FIG. 2A, a substrate 22 is provided whereon the quantum computer 200 will be built up layer by layer. The substrate 22 can comprise, for example, an intrinsic (i.e. not intentionally doped) silicon substrate 22 having a layer of a thermal oxide formed thereon. The layer of the thermal oxide can be, for example, about 20 nm thick.

Figure 2B:
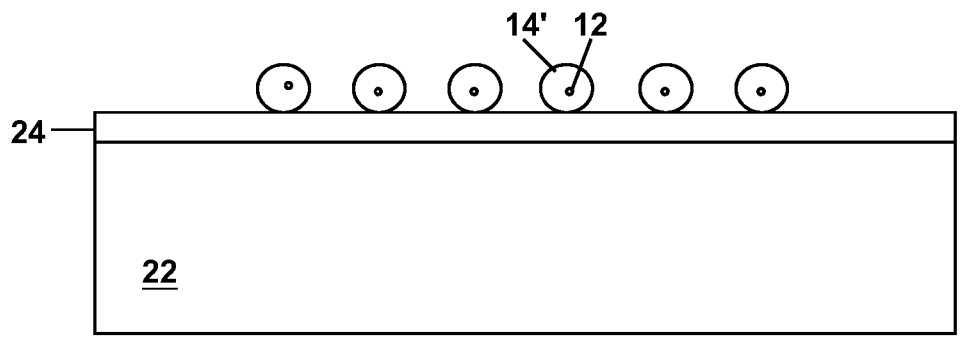

In FIG. 2B, a number of the selected nanocrystals 14' which have been prepared as previously described with reference to FIGS. 1A-1G with the atoms 12 of the atomic species of interest being phosphorous-31 atoms can be removed from the silicon substrate 16 using the AFM tip 110 and inserted onto the substrate 22 using the AFM tip 110. the nanocrystals 14' are shown enlarged in FIGS. 2B-2D to schematically illustrate the phosphorous-31 atom 12 within each selected nanocrystal 14'. In FIG. 2B, the selected nanocrystals 14' can arranged on the substrate 22 in a one-dimensional (1-D) array, or in a two-dimensional (2-D) array. A spacing between adjacent nanocrystals 14' in the 1-D or 2-D array can be, for example, about 20 nm or less, with each selected nanocrystal 14' being, for example, 5-10 nm in diameter. The exact location of the phosphorous-31 atom 12 within each selected nanocrystal 14' will generally be unknown. The phosphorous-31 atom 12 within each selected nanocrystal 14' can be used to form a quantum bit (also referred to as a qubit) in the quantum computer 200 being built up on the substrate 22. The ability to form the selected nanocrystals 14' containing a single phosphorous-31 atom 12 according to the present invention and then to place them precisely in the 1-D or 2-D array solves a long-felt need for the fabrication of quantum computers.

Phosphorous-31 is advantageous for use in forming qubits in a quantum computer due to its electron and nuclear spins which form a hydrogenic spin qubit which can be controlled and coupled to provide for a transfer of quantum logic-state information between adjacent qubits via single electron shuttling. An important criteria in forming a quantum computer is to isolate the qubits sufficiently to prevent decoherence of the qubits due to interactions with adjacent atoms. The selected nanocrystals 14' serve this function since they can be formed from silicon-28 as previously described so that each silicon atom in the selected nanocrystals 14' has a nuclear spin I=0 and therefore cannot interact with the single phosphorous-31 atom 12 in the nanocrystal 14' which has a nuclear spin I=½. By locating the qubit formed by each phosphorous-31 atom 12 within the selected nanocrystal 14' it is expected that a relatively long decoherence time can be attained even though the selected nanocrystals 14' will be surrounded by other materials (e.g. silicon dioxide).

Figure 2C:
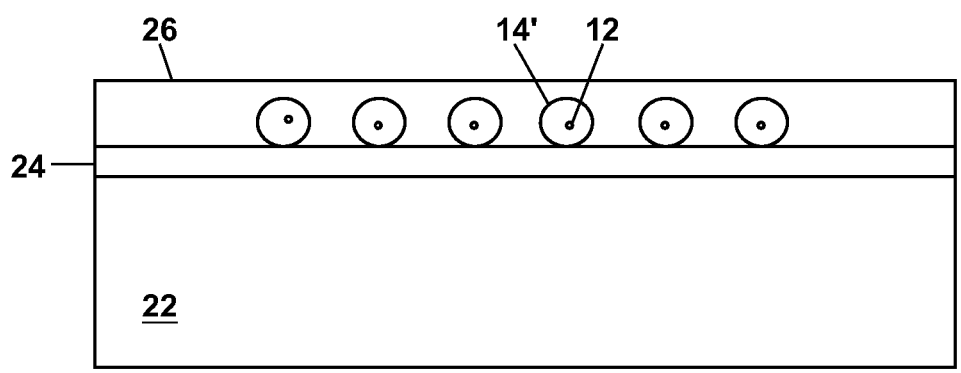

In FIG. 2C, the selected nanocrystals 14' can be secured in place on the substrate 22 by depositing an electrically-insulating layer 26 over the substrate 22. The electrically-insulating layer 26 can comprise a layer of silicon dioxide which can be deposited by chemical vapor deposition (CVD).

Figure 2D:
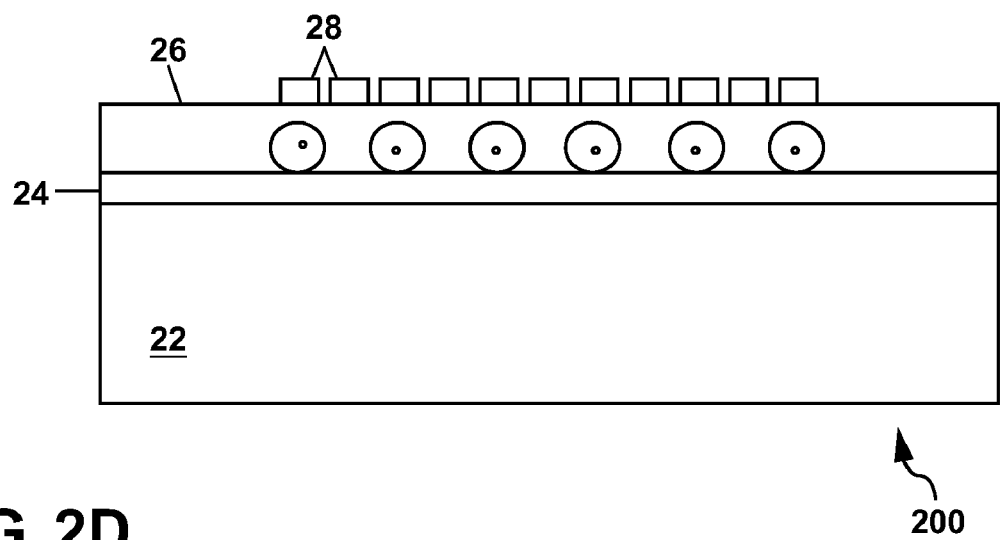

In FIG. 2D, a plurality of electrodes 28 can be formed over the electrically-insulating layer 26 to complete the quantum computer 200, with the electrodes 28 being spaced apart over each selected nanocrystal 14' and between each pair of adjacent selected nanocrystals 14'. The electrodes 28 can comprise a thin layer (e.g. 20 nm) of aluminum or gold which can be blanket deposited over an e-beam patterned resist (not shown), with the electrodes 28 then being patterned by lift-off. Each electrode 28 can be, for example, 10-15 nm wide at the location of the nanocrystals 14'.

The electrodes 28 located directly above the selected nanocrystals 14' can be used to draw a single outer electron off the nucleus of the phosphorous-31 atom 12 therein. This provides a way to control and switch off a coupling between the electron and nuclear spins of the phosphorous-31 atom 12 via the hyperfine interaction. The electrodes 28 located between adjacent nanocrystals 14' can be used to control the electron wave functions of the phosphorous-31 atoms 12 in the adjacent nanocrystals 14'. This provides an gate-mediated interaction between the adjacent nanocrystals 14' which is useful for two qubit gates to couple the quantum logic-state information therebetween. Possible interaction mechanisms are dipole interactions or perhaps the exchange interaction if the oxide barrier between the nanocrystals is thin enough.

In other types of nanoscale electrical or optical devices formed using the method of the present invention, one or more selected nanocrystals 14' containing a single atom 12 of an atomic species of interest can be placed onto a silicon substrate using the AFM tip 110 and then secured on the silicon substrate by depositing a layer of silicon over the silicon substrate to cover the selected nanocrystals 14'. Deposition of the layer of silicon can be performed by CVD. An additional layer of an electrically-insulating material such as silicon dioxide can be provided overtop the deposited silicon when electrodes are to be provided thereabove. This can be useful, for example, to form a quantum computer similar with each qubit being surrounded by the deposited silicon rather than being surrounded by the electrically-insulating layer 26 as shown in FIGS. 2C and 2D.

The silicon nanocrystals 14 formed according to the present invention with a single atom 12 of the atomic species of interest therein can also be used to form a single-photon light source. This can be done by preparing the silicon nanocrystals 14 as previously described with reference to FIGS.

1A-1E using erbium as the atomic species of interest, and then using SCM or EFM to identify which of the silicon nanocrystals 14 contain exactly one erbium atom 12 therein. The AFM tip 110 can then be used to select one of the silicon nanocrystals 14 which has a single erbium atom 12 therein and to insert that nanocrystal 14 into an optical cavity to form the single-photon light source. The optical cavity can comprise, for example, a Fabry-Perot cavity or a distributed-Bragg-reflector cavity having a pair of spaced-apart mirrors. Alternately, the optical cavity can comprise a ring cavity (e.g. a microdisc cavity), or a photonic lattice.

When formed with erbium as the atomic species of interest, the single-photon light source will emit single photons of light at a wavelength near 1.5 µm which is useful for coupling to an optical fiber. Pumping of the single-photon light source can be performed optically using a laser. Single-photon light sources can be used, for example, for quantum communications, for cryptography, and for quantum information processing. Further details of single-photon light sources can be found in the following articles: B. Lounis et al., "Single-Photon Sources," *Reports on Progress in Physics*, vol. 68, pp. 1129-1179, 2005, and M. Oxborrow et al., "Single-Photon Sources," *Contemporary Physics*, vol. 46, pp. 173-206, May-June 2005.

The matter set forth in the foregoing description and accompanying drawings is offered by way of illustration only and not as a limitation. The actual scope of the invention is intended to be defined in the following claims when viewed in their proper perspective based on the prior art.

What is claimed is:

1. A method for isolating single atoms of an atomic species of interest within silicon nanocrystals to provide for movement of each single atom using an atomic force microscope tip to move the silicon nanocrystal containing that single atom, comprising the steps of:
    providing a substrate having the silicon nanocrystals located thereon;
    implanting the silicon nanocrystals with ions of the atomic species of interest at an ion energy and at an ion dose rate which statistically implants, on average, only one of the ions of the atomic species of interest into each silicon nanocrystal; and
    measuring an electrical charge distribution of the silicon nanocrystals and thereby identifying which of the silicon nanocrystals contain the single atom of the atomic species of interest and which of the silicon nanocrystals contain a different number of atoms of the atomic species of interest.

2. The method of claim 1 further comprising a step of separating with an atomic force microscope tip at least one of the silicon nanocrystals containing the single atom of the atomic species of interest from the silicon nanocrystals containing the different number of atoms of the atomic species of interest.

3. The method of claim 2 wherein the step of separating the silicon nanocrystals with the atomic force microscope tip comprises removing the at least one silicon nanocrystal containing the single atom of the atomic species of interest from the substrate and placing the at least one silicon nanocrystal containing the single atom of the atomic species of interest onto another substrate using the atomic force microscope tip.

4. A method for isolating single atoms of an atomic species of interest within silicon nanocrystals so that each single atom can be moved by moving the silicon nanocrystal containing that single atom with an atomic force microscope tip, comprising the steps of:
    forming on a substrate a layer of a silicon-rich oxide;
    thermally annealing the layer of the silicon-rich oxide and thereby phase segregating the layer of the silicon-rich oxide to form a layer of silicon oxide and to form the silicon nanocrystals within the layer of silicon oxide;
    implanting the silicon nanocrystals with ions of the atomic species of interest at an ion energy and at an ion dose rate which statistically implants, on average, only one of the ions of the atomic species of interest into each silicon nanocrystal;
    etching away the silicon oxide and thereby releasing the silicon nanocrystals from the layer of silicon oxide, with the silicon nanocrystals being disposed on the substrate;
    measuring an electrical charge distribution on a set of the silicon nanocrystals using the atomic force microscope tip and thereby identifying which silicon nanocrystals in the set of silicon nanocrystals have the single atom of the atomic species of interest located therein; and
    spatially separating with the atomic force microscope tip the silicon nanocrystals having the single atom of the atomic species of interest located therein from a remainder of the set of the silicon nanocrystals which have a greater or a lesser number of atoms of the atomic species of interest.

5. The method of claim 4 wherein the step of forming on a substrate the layer of the silicon-rich oxide comprises forming the layer of the silicon-rich oxide on an electrically-conducting substrate.

6. The method of claim 4 wherein the step of forming on a substrate the layer of the silicon-rich oxide comprises forming the layer of the silicon-rich oxide on a silicon substrate.

7. The method of claim 4 wherein the step of forming on the substrate the layer of the silicon-rich oxide comprises depositing the layer of the silicon-rich oxide on the substrate by chemical vapor deposition.

8. The method of claim 4 wherein the step of forming on the substrate the layer of the silicon-rich oxide comprises thermally oxidizing a portion of a silicon substrate and forming therefrom a layer of a thermal oxide, and then implanting silicon ions into the layer of the thermal oxide and thereby converting the layer of the thermal oxide into the layer of the silicon-rich oxide.

9. The method of claim 4 wherein the step of thermally annealing the layer of the silicon-rich oxide comprises thermally annealing the layer of the silicon-rich oxide at a temperature in the range of 1000-1200° C.

10. The method of claim 4 wherein the step of thermally annealing the layer of the silicon-rich oxide forms silicon nanocrystals having dimensions in the range of 1-30 nanometers.

11. The method of claim 4 wherein the atomic species of interest comprises phosphorous.

12. The method of claim 4 wherein the atomic species of interest comprises erbium.

13. The method of claim 4 further comprising a step of thermally annealing the plurality of silicon nanocrystals after the step of implanting the silicon nanocrystals with the ions of the atomic species of interest.

14. The method of claim 4 wherein the step of etching the silicon oxide comprises etching the silicon oxide with an etchant comprising hydrofluoric acid (HF).

15. The method of claim 4 wherein the step of spatially separating the silicon nanocrystals having the single atom of the atomic species of interest located therein comprises moving with an atomic force microscope tip the silicon nanocrystals having the single atom of the atomic species of interest located therein.

16. A method for inserting single atoms of an atomic species of interest into a quantum computer which is being built up, comprising the steps of:

isolating the single atoms of the atomic species in silicon nanocrystals by:

providing a first substrate;

forming on the first substrate a layer of a silicon-rich oxide;

thermally annealing the layer of the silicon-rich oxide and thereby converting the layer of the silicon-rich oxide into a layer of silicon oxide containing the silicon nanocrystals;

implanting the silicon nanocrystals with ions of the atomic species of interest at an ion energy and at an ion dose rate which statistically implants, on average, only one of the ions of the atomic species of interest into each silicon nanocrystal; and etching away the layer of silicon oxide to release the silicon nanocrystals;

measuring a electrical charge distribution in the silicon nanocrystals using the atomic force microscope tip and thereby identifying which of the silicon nanocrystals contain the single atom of the atomic species of interest; and removing a portion of the silicon nanocrystals containing the single atom of the atomic species of interest from the first substrate using the atomic force microscope tip, and re-locating the portion of the silicon nanocrystals containing the single atom of the atomic species of interest onto a second substrate to form a plurality of quantum bits in the quantum computer being built up on the second substrate.

17. The method of claim 16 further comprising a step of securing each silicon nanocrystal on the second substrate by depositing an electrically-insulating layer over the second substrate.

18. The method of claim 17 further comprising a step of depositing a plurality of spaced-apart electrodes over the electrically-insulating layer with one of the plurality of electrodes being located above each silicon nanocrystal.

19. The method of claim 16 wherein the step of implanting the silicon nanocrystals with ions of the atomic species of interest comprises implanting phosphorous-31 ions.

* * * * *